United States Patent [19]
Borisch et al.

[11] Patent Number: 5,820,387
[45] Date of Patent: Oct. 13, 1998

[54] SURFACE-MOUNTED PLUG-IN CONNECTOR

[75] Inventors: Wolfgang Borisch, Bad Abbach-Peising; Christian Beuther, Regensburg; Erich Schreib, München, all of Germany

[73] Assignee: Siemens Aktiengesellschaft, München, Germany

[21] Appl. No.: 764,709

[22] Filed: Dec. 2, 1996

[30] Foreign Application Priority Data

May 31, 1994 [EP] European Pat. Off. ............... 94108392

[51] Int. Cl.⁶ ....................................................... H01R 9/09
[52] U.S. Cl. .............................................. 439/79; 439/326
[58] Field of Search ................................ 439/79, 80, 567, 439/326

[56] References Cited

U.S. PATENT DOCUMENTS

| 4,676,565 | 6/1987 | Reichardt | 439/79 |
| 4,772,210 | 9/1988 | Vanaleck | 439/55 |
| 5,035,641 | 7/1991 | Van-Santbrink et al. | 439/567 |
| 5,230,633 | 7/1993 | Hisatomi et al. | 439/79 |

FOREIGN PATENT DOCUMENTS

| 0511655A3 | 11/1992 | European Pat. Off. |
| 8432252 | 2/1985 | Germany |
| 4016890A1 | 11/1991 | Germany |
| 1-107479 | 4/1989 | Japan |

*Primary Examiner*—Neil Abrams
*Assistant Examiner*—T. C. Patel
*Attorney, Agent, or Firm*—Herbert L. Lerner; Laurence A. Greenberg

[57] ABSTRACT

A plug-in connector is introduced into a mounting hook as far as a stop and pivoted toward a printed circuit board for mounting. Fixation elements thereby lock in holes in the printed circuit board in detent fashion and secure the plug-in connector to the printed circuit board. The plug-in connector can then be soldered in one operation together with remaining SMDs of the printed circuit board.

5 Claims, 3 Drawing Sheets

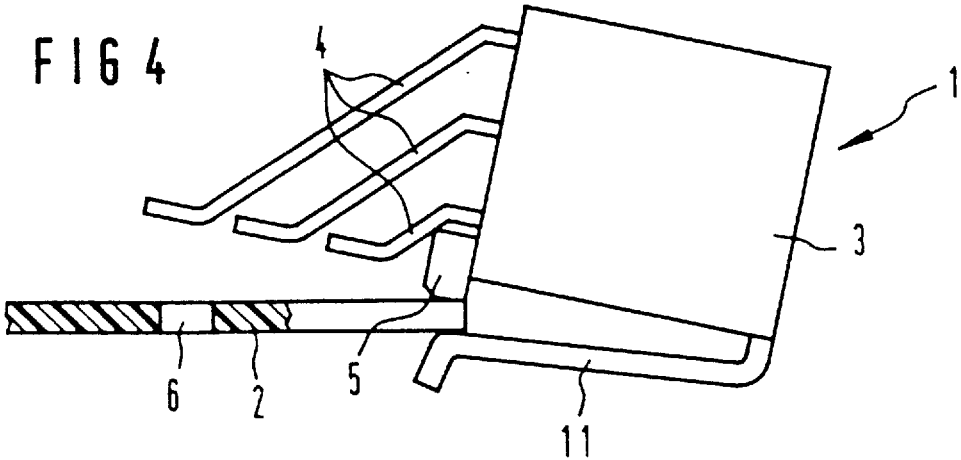
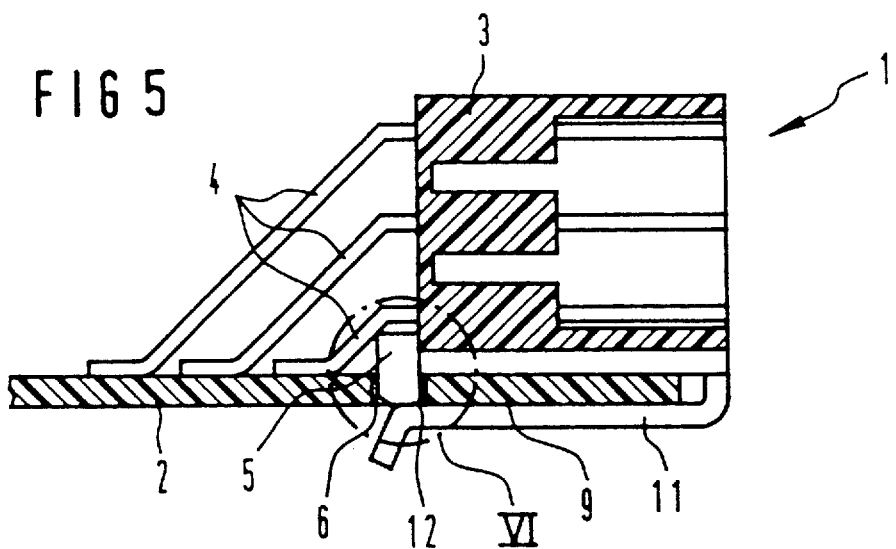
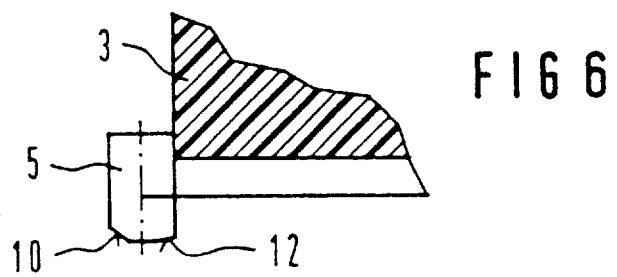

SURFACE-MOUNTED PLUG-IN CONNECTOR

CROSS-REFERENCE TO RELATED APPLICATION

This application is a continuation of International application Ser. No. PCT/EP95/01714, filed May 5, 1995.

BACKGROUND OF THE INVENTION

1. Field of the Invention

The invention relates to a surface-mounted plug-in connector that has a strip body and terminal contacts and is secured to a printed circuit board.

It is known from a publication entitled: Der Elektroniker [The Electronic Engineer] No. 3/1986, pp. 64–69, to mount plug-in connectors as SMD components (Surface-Mounted Devices) on a component side of a printed circuit board. The plug-in connectors are secured to the printed circuit board not only by soldered points at their terminal contacts but also mechanically, such as with screws or rivets or the like. However, such fasteners make automatic assembly quite complicated and expensive.

SUMMARY OF THE INVENTION

It is accordingly an object of the invention to provide a surface-mounted plug-in connector, which overcomes the hereinafore-mentioned disadvantages of the heretofore-known devices of this general type and which can be secured simply and quickly to a printed circuit board.

With the foregoing and other objects in view there is provided, in accordance with the invention, a surface-mounted plug-in connector to be secured to a printed circuit board, the plug-in connector comprising a strip body; terminal contacts associated with the strip body for connection to a printed circuit board having an edge; at least one mounting hook secured to the strip body for griping the edge of the printed circuit board and acting as a stop about which the plug-in connector is pivoted during mounting; and at least one fixation element protruding out of the strip body, entering into a hole formed in the printed circuit board upon pivoting of the strip body and detent locking in the hole for securing the plug-in connector to the printed circuit board.

In accordance with another feature of the invention, there is provided a spreader pin guided through a bore formed in the strip body for spreading the fixation element apart in the hole in the printed circuit board.

In accordance with a further feature of the invention, the fixation element is a detent hook integral with the strip body for detent locking in the hole in the printed circuit board.

In accordance with an added feature of the invention, the strip body, the fixation element and the mounting hook are integrally formed of insulating material. Fewer mounting steps are needed if the mounting hook and the fixation element are produced in one piece together with the strip body.

In accordance with an additional feature of the invention, the mounting hook has an insertion chamfer. Mounting is made easier by the slide chamfers of the mounting hook.

In accordance with a concomitant feature of the invention, the mounting hook is resilient and temporarily secures the plug-in connector to the printed circuit board.

In order to mount the plug-in connector, the plug-in connector is thrust as far as a stop of a mounting hook above the printed circuit board and is then pivoted by a securing element into a hole of the printed circuit board. The securing element locks in detent fashion in the hole.

Due to the way in which the fixation element and the mounting hook are constructed, this has the advantage of ensuring that the terminal contacts of the plug-in connector will not wipe away the solder paste during mounting. As a result of being secured with the aid of the fixation element, the soldered points are advantageously not mechanically stressed.

Other features which are considered as characteristic for the invention are set forth in the appended claims.

Although the invention is illustrated and described herein as embodied in a surface-mounted plug-in connector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a side-elevational view of a further plug-in connector according to the invention, at the onset of mounting on a printed circuit board;

FIG. 5 is a vertical-sectional view through the plug-in connector of FIG. 4 in the mounted state; and FIG. 6 is an enlarged, fragmentary view of a portion VI of the vertical-sectional view of the plug-in connector of FIG. 5.

DESCRIPTION OF THE PREFERRED EMBODIMENTS

Surface-mounted devices (SMDs) are increasingly being used in control units for motor vehicles. They save space and can be assembled automatically. The intent is to use plug-in connectors as surface-mounted devices in the same way.

Figure 1:
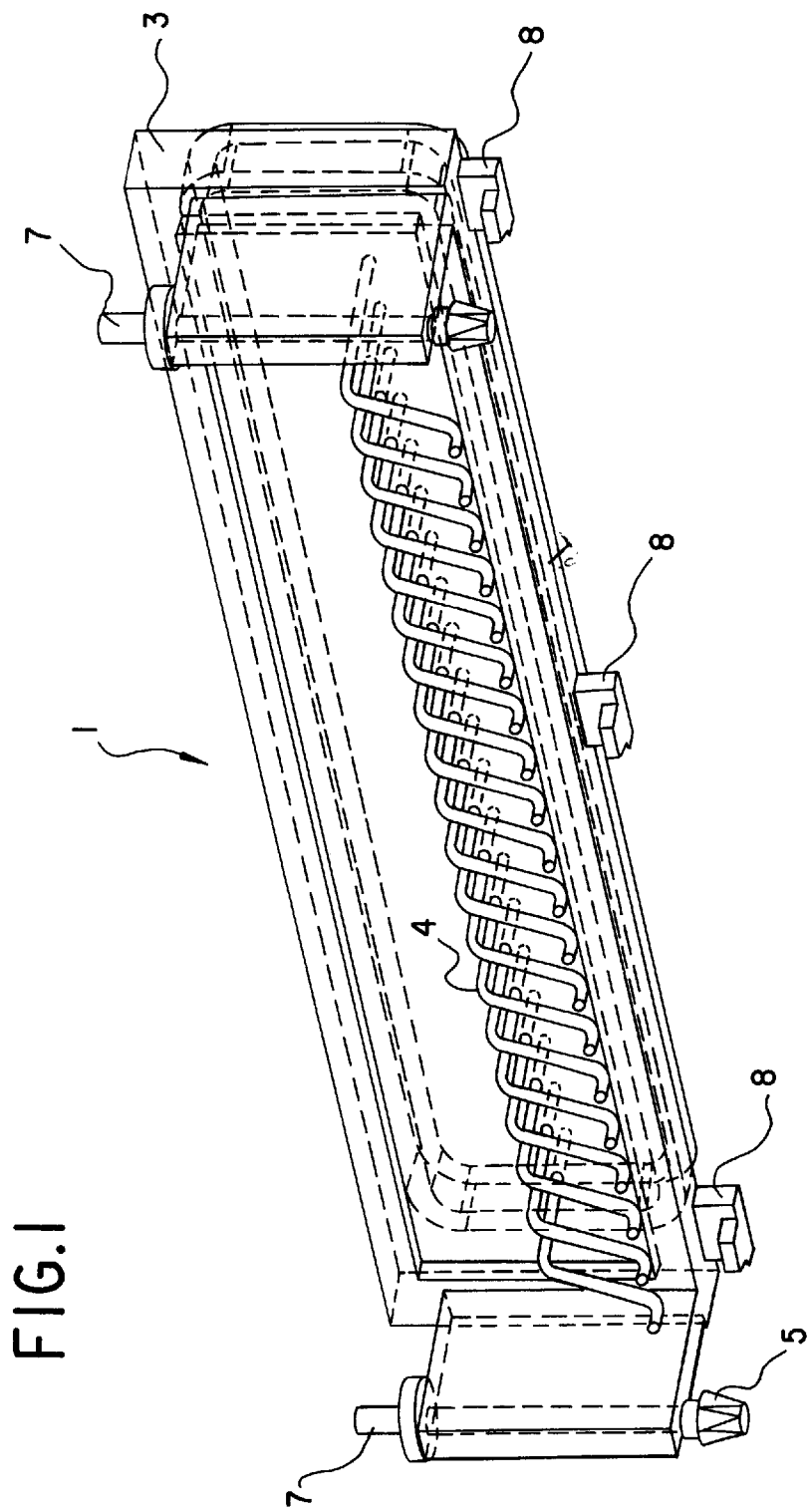
FIG. 1 is a diagrammatic, perspective view of a plug-in connector according to the invention.
Figure 2:
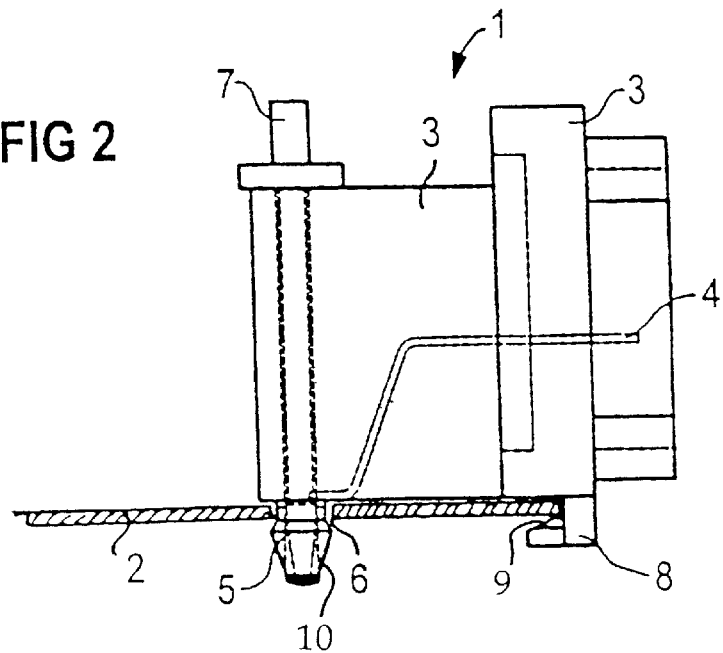
FIG. 2 is a side-elevational view of the plug-in connector of FIG. 1.

Referring now to the figures of the drawings in detail and first, particularly, to FIG. 1 thereof, there is seen a surface-mounted plug-in connector 1 according to the invention, for instance a knife strip, that is to be secured to a printed circuit board 2 as shown in FIG. 2. The plug-in connector 1 has a strip body 3, through which electrical terminal contacts 4 are passed. These contacts are soldered on one side to the printed circuit board 2 and on the other side are connected to a non-illustrated counterpart plug and a connection cable.

The terminal contacts 4 are bent twice toward the printed circuit board and ends of the terminal contacts 4 are bent approximately parallel to the plane of the printed circuit board 2. These ends are later soldered to the printed circuit board 2.

The plug-in connector 1 has at least two fixation elements 5 which protrude downward from the strip body 3, toward the printed circuit board 2, and are locked in detent fashion in holes 6 in the printed circuit board. The fixation elements 5 are constructed in this case as spreading dowels that are integral with the strip body 3. To that end, the fixation elements 5 are constructed annularly with a convex detent protrusion and are slit in the axial direction so that they can spread apart. The fixation elements 5 are disposed coaxially with bores in the strip body 3.

The plug-in connector 1 is secured to the printed circuit board 2 with the aid of a fixation or spreader pin 7, which is brought from outside, inserted through the bore in the strip body 3, and press-fitted into the fixation element 5.

The strip body 3 also has mounting hooks 8, which are likewise disposed on the lower surface of the plug-in connector 1. The mounting hooks 8 have introduction chamfers 9, which facilitate the mounting of the plug-in connector 1.

Figure 3:
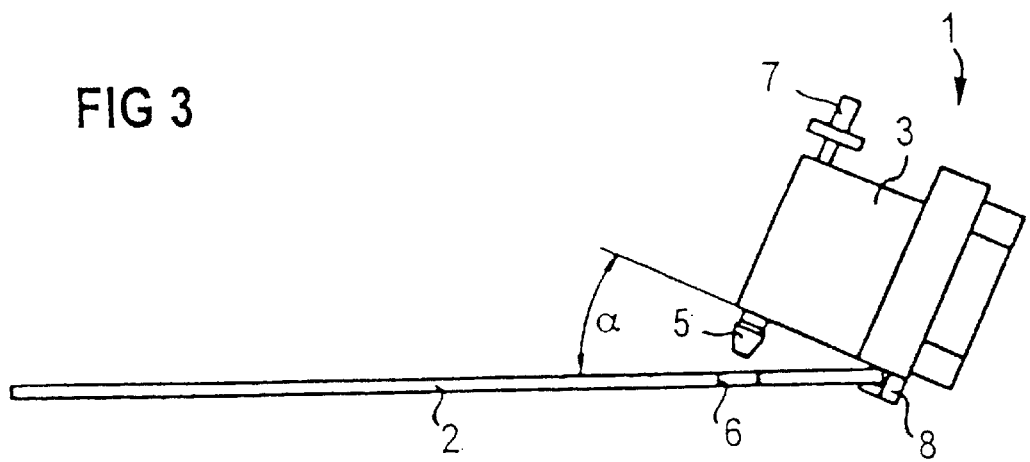
FIG. 3 is a side-elevational view of the plug-in connector during mounting.

At the beginning of the mounting of the plug-in connector 1 as seen in FIG. 3, the printed circuit board 2 is thrust into the mounting hook 8 along the insertion chamfer 9 until it meets a stop. To that end, the plug-in connector 1 has to be tilted by an angle α of about 25° relative to the printed circuit board 2. The angle α is dependent on the height of the fixation element 5, the diameter of the holes 6 in the printed circuit board 2, and the structure of the mounting hook 8 and its insertion chamfer 9.

Next, the plug-in connector 1 is pivoted toward the printed circuit board 2 in such a way that the fixation elements 5 are inserted through the corresponding holes 6 in the printed circuit board 2 and are locked there in detent fashion. The insertion of the fixation elements 5 into the holes 6 positions the plug-in connector in its position. In order to make the detent locking in the holes 6 easier, the fixation elements 5 have mounting chamfers 10, or in other words they are slightly pointed.

Since the fixation elements 5 are constructed as detent hooks, a certain force must be overcome in order to press the fixation elements 5 into the holes 6. The mounting hooks 8 serve as an abutment to withstand this force. At the same time, the mounting hooks also act as a guide in the pivoting toward the printed circuit board 2.

Once the fixation elements 5 have spread apart with the aid of the fixing pins 7, the terminal contacts 4 can be soldered together with the remaining components of the printed circuit board 2. Since the plug-in connector 1 is already secured to the printed circuit board 2 before the soldering process is performed, the soldering points of the terminal contacts 4 are mechanically relieved.

In the mounting of the plug-in connector 1, solder paste, which is applied to solder spots of the printed circuit board 2 in order to solder the terminal contacts 4, is not wiped away by the terminal contacts 4 or even partly removed, since the terminal contacts 4 do not descend from above onto the printed circuit board 2 until they are in their final position.

The terminal contacts 4 rest flatly on the printed circuit board 2 once the fixation elements 5 have locked into place in the holes 6 in the printed circuit board 2.

A further exemplary embodiment of a plug-in connector 1 according to the invention is shown in FIGS. 4–6. Elements of the same construction or function are identified by the same reference numerals as in FIGS. 1–3.

In this plug-in connector 1, the mounting hook 8 is constructed resiliently and will be referred to below as a retaining clip 11. At the beginning of mounting of the plug-in connector 1 as seen in FIG. 4, the retaining clip 11 is bent away from the strip body 3. In other words, the retaining clip 11 is spread apart, and the fixation element 5 is placed on the printed circuit board 2. As a result, the plug-in connector 1 can be pushed onto the printed circuit board 2 in the position in which the plug-in connector is to be soldered. In the process, the edge of the printed circuit board 2 is inserted between the retaining clip 11 and the strip body 3.

The fixation element 5 protrudes out of the strip body 3. As a result, during the mounting, the fixation element 5 slides along the printed circuit board 2. Since in this case there are only two fixation elements 5, and they are disposed at the edge of the plug-in connector 1, that is at a location where there are no terminal contacts 4, the solder paste is not wiped away by the fixation elements 5 during mounting.

The ends of the terminal contacts 4 are kept away from the printed circuit board 2 by the fixation elements 5, since the plug-in connector 1 can only be mounted in a tilted position, as is shown in FIG. 4.

In order to facilitate mounting and avert damage to the printed circuit board 2, the fixation elements 5 each have a sliding chamfer 12 shown in FIG. 6, which slides along the printed circuit board 2 during the insertion of the plug-in connector 1. The sliding chamfer has an angle of approximately 5° to 10°.

The retaining clip 11 has an angled end, with which the spreading apart, threading in and insertion of the plug-in connector 1 is likewise facilitated.

The fixation elements 5 lock in detent fashion in the holes 6 in the printed circuit board 2 as soon as the plug-in connector 1 has reached its final position. In that process the terminal contacts 4 are lowered onto non-illustrated surfaces to be soldered of the printed circuit board 2. The strip body 3 then rests on the printed circuit board 2, and the ends of the terminal contacts 4 dip into solder paste that has been applied to the surfaces to be soldered.

The holes 6 secure the plug-in connector 1 in such a way that it only has little motion tolerance in the direction of the plane of the printed circuit board. To that end, the diameter of a fixation element 5 must not be much smaller than the diameter of a hole 6. The plug-in connector 1 is held by the retaining clip 11 in the direction perpendicular to the printed circuit board 2, so that the fixation element 5 cannot fall out of the hole. Consequently the plug-in connector 1 is temporarily secured to the printed circuit board 2.

In the soldering position, the terminal contacts 4 can be soldered together with the remaining SMDs of the printed circuit board 2 in one operation, as a result of which the plug-in connector 1 is additionally secured mechanically to the printed circuit board 2. As a result of the temporary securing using the fixation elements 5 and the retaining clips 11, the soldering points remain mechanically unstressed.

The leg of the retaining clip 11 is constructed in such a way that the printed circuit board 2 cannot be thrust all the way into the retaining clip 11. In this way, the leg of the retaining clip 11 can still exert a force upon the printed circuit board 2 and clamp it between the leg and the strip body 3. This is accomplished by constructing the leg of the retaining clip 11 so as not to be entirely parallel to the strip body 3 but rather to have an insertion chamfer 9 of about 5°. In other words, the leg extends slightly away from the strip body 3. Moreover, the closest spacing of the leg is less than the thickness of the printed circuit board 2. Consequently, the retaining clip 11 also acts as a stop for the printed circuit board 2.

In addition to the sliding chamfer 12, the end of each fixation element 5 has the mounting chamfer 10, which facilitates the detent locking of the fixation element 5 into the hole 6.

It is advantageous for the fixation elements 5 and the holes 6 to be round. This largely averts canting in the course of detent locking, and the plug-in connector 1 can be positioned in its position with quite a small tolerance. It is thus assured that the terminal contacts 4 rest accurately on the surfaces to be soldered of the printed circuit board 2 and do not cause any short circuiting to other conductor tracks on the printed circuit board 2.

The strip body 3 is produced integrally together with the fixation elements 5 and the retaining clips 11 or mounting hooks 8, for instance by injection molding, from insulating material, such as plastic.

The number of fixation elements 5 and mounting hooks 8 which are present is not essential to the invention. Two fixation elements 5 and two mounting hooks 8 have proven to be quite favorable.

We claim:

1. A surface-mounted plug-in connector to be secured to a printed circuit board, the plug-in connector comprising:

a strip body; terminal contacts associated with said strip body for connection to a printed circuit board having an edge;

at least one mounting hook having an insertion chamfer secured to said strip body for griping the edge of the printed circuit board and acting as a stop about which the plug-in connector is pivoted during mounting of the printed circuit board, said insertion chamfer allowing said strip body to be tilted at an angle relative to the printed circuit board for allowing said strip body to be mounted on the printed circuit board without said terminal contacts contacting the printed circuit board; and at least one fixation element protruding out of said strip body, entering into a hole formed in the printed circuit board upon pivoting of said strip body and detent locking in the hole for securing the plug-in connector to the printed circuit board.

2. The plug-in connector according to claim 1, including a spreader pin guided through a bore formed in said strip body for spreading said fixation element apart in the hole in the printed circuit board.

3. The plug-in connector according to claim 1, wherein said fixation element is a detent hook integral with said strip body for detent locking in the hole in the printed circuit board.

4. The plug-in connector according to claim 1, wherein said strip body, said fixation element and said mounting hook are integrally formed of insulating material.

5. The plug-in connector according to claim 1, wherein said mounting hook is resilient and temporarily secures the plug-in connector to the printed circuit board.

* * * * *

UNITED STATES PATENT AND TRADEMARK OFFICE
CERTIFICATE OF CORRECTION

PATENT NO : 5,820,387
DATED : October 13, 1998
INVENTOR(S): Wolfgang Borisch et al.

It is certified that error appears in the above-identified patent and that said Letters Patent is hereby corrected as shown below:

Title page,
Item [63] should read as follows:

Continuation of PCT/EP95/01714, May 5, 1995.

Signed and Sealed this

Twenty-first Day of September, 1999

Attest:

Q. TODD DICKINSON

*Attesting Officer*     *Acting Commissioner of Patents and Trademarks*